(12) United States Patent
Yoon

(10) Patent No.: US 7,906,906 B2
(45) Date of Patent: Mar. 15, 2011

(54) LIGHT EMITTING DEVICE HAVING SPACER FOR PROTECTING LIGHT EMISSION UNIT FROM MOISTURE ABSORBENT

(75) Inventor: Jong Geun Yoon, Anyang-si (KR)

(73) Assignee: LG Display Co., Ltd., Seoul (KR)

( * ) Notice: Subject to any disclaimer, the term of this patent is extended or adjusted under 35 U.S.C. 154(b) by 552 days.

(21) Appl. No.: 11/919,829

(22) PCT Filed: Mar. 25, 2006

(86) PCT No.: PCT/KR2006/001106
§ 371 (c)(1),
(2), (4) Date: Nov. 2, 2007

(87) PCT Pub. No.: WO2006/101378
PCT Pub. Date: Sep. 28, 2006

(65) Prior Publication Data
US 2008/0136319 A1 Jun. 12, 2008

(30) Foreign Application Priority Data
Mar. 25, 2005 (KR) .................. 10-2005-0025202
Mar. 25, 2005 (KR) .................. 10-2005-0025203

(51) Int. Cl.
*H01J 1/62* (2006.01)
*H01J 63/04* (2006.01)
(52) U.S. Cl. ........ 313/512; 313/483; 313/498; 313/500; 313/506; 313/501; 313/504
(58) Field of Classification Search .................. None
See application file for complete search history.

(56) References Cited

U.S. PATENT DOCUMENTS

| 6,833,668 | B1 | 12/2004 | Yamada et al. | |
| 7,019,458 | B2 * | 3/2006 | Yoneda | 313/512 |
| 7,026,660 | B2 * | 4/2006 | Guenther et al. | 257/100 |
| 7,196,465 | B2 * | 3/2007 | Park et al. | 313/505 |
| 7,649,311 | B2 * | 1/2010 | Park et al. | 313/505 |
| 2002/0070663 | A1 | 6/2002 | Ogura et al. | |
| 2002/0074938 | A1 * | 6/2002 | Gu | 313/512 |
| 2003/0184222 | A1 * | 10/2003 | Nilsson et al. | 313/512 |

FOREIGN PATENT DOCUMENTS

| CN | 1599517 | 3/2005 |
| EP | 0 969 700 A1 | 6/1999 |
| JP | 10134959 A * | 5/1998 |
| JP | 2002-151252 | 5/2002 |

OTHER PUBLICATIONS

English machine translation of JP 10-134959 (Noma et al).*
English machine translation of JP 2002-151252 (Kashima et al).*

* cited by examiner

*Primary Examiner* — Nimeshkumar D Patel
*Assistant Examiner* — Natalie K Walford
(74) *Attorney, Agent, or Firm* — Morgan, Lewis & Bockius LLP

(57) ABSTRACT

A light emitting device is provided. The light emitting device includes a substrate including a non-emission region and an emission region, an emission unit which is located on the subsrate and includes a first electrode, a second electrode and an emission layer interposed between the first and second electrodes, a shield cap adhered to the substrate to encapsulate the emission unit, and an inert liquid or an inert gas in a space between the substrate and the shield cap.

17 Claims, 4 Drawing Sheets

[Fig. 1] Related Art
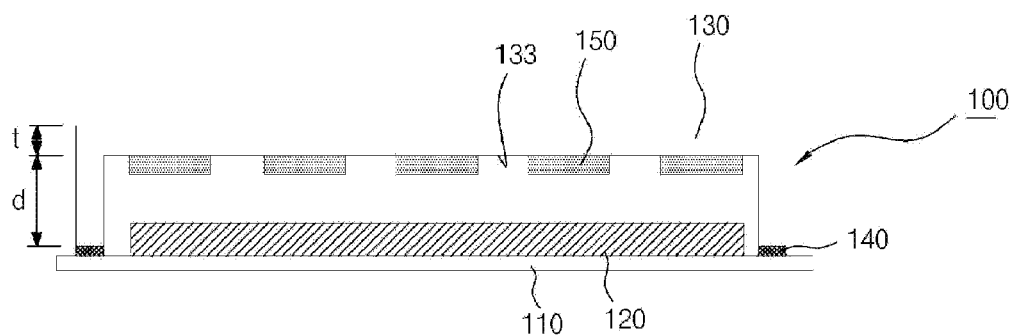
[Fig. 2] Related Art
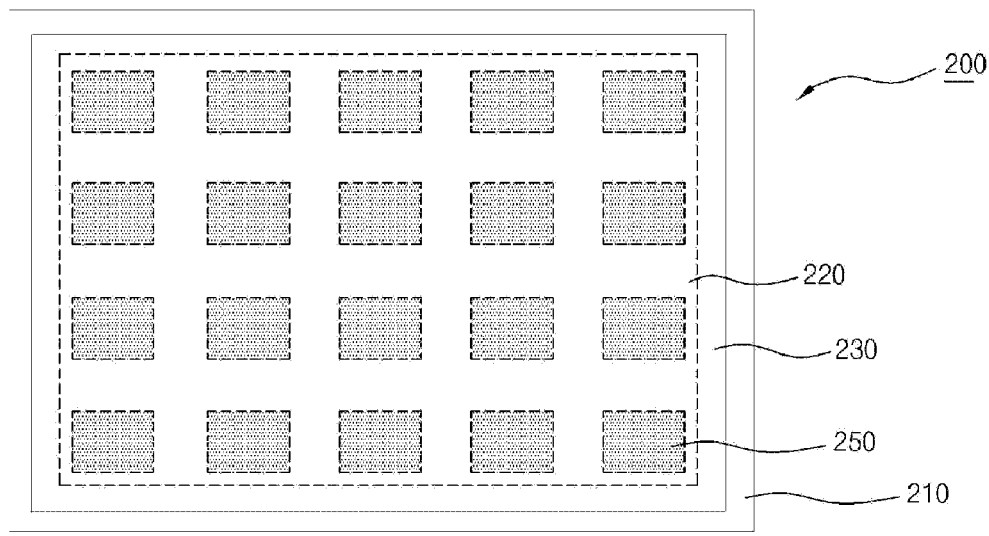
[Fig. 3]
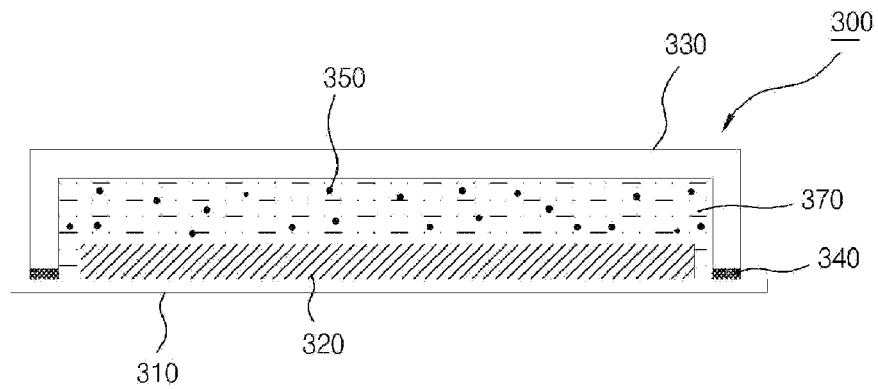

[Fig. 4]
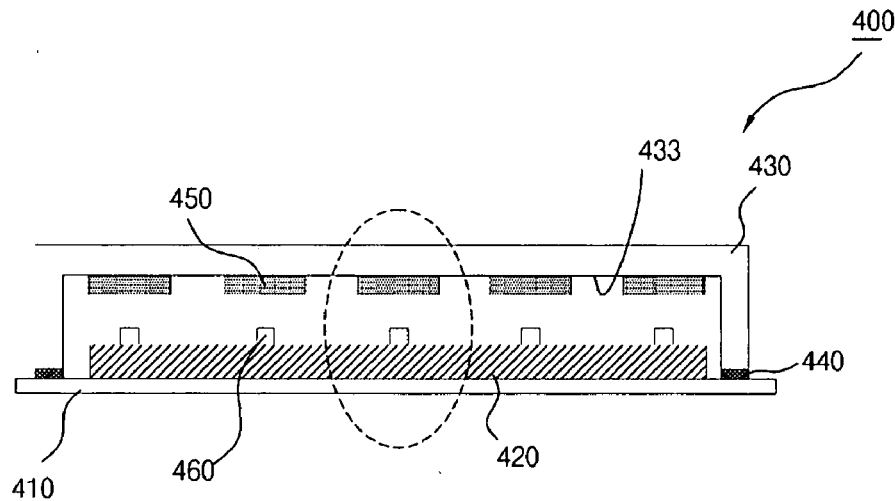
[Fig. 5]
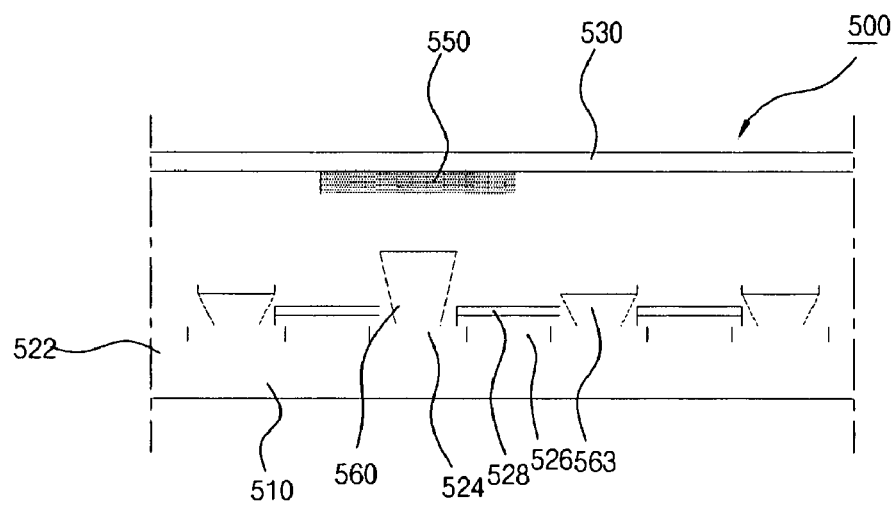
[Fig. 6]
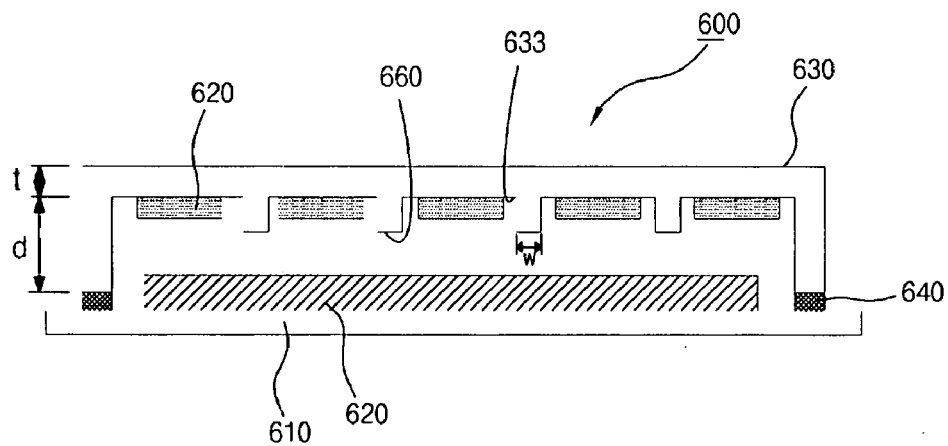

[Fig. 7]
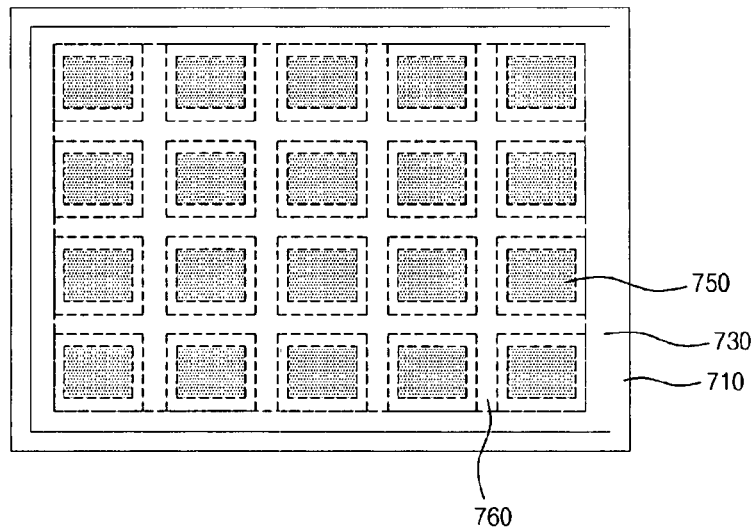
[Fig. 8]
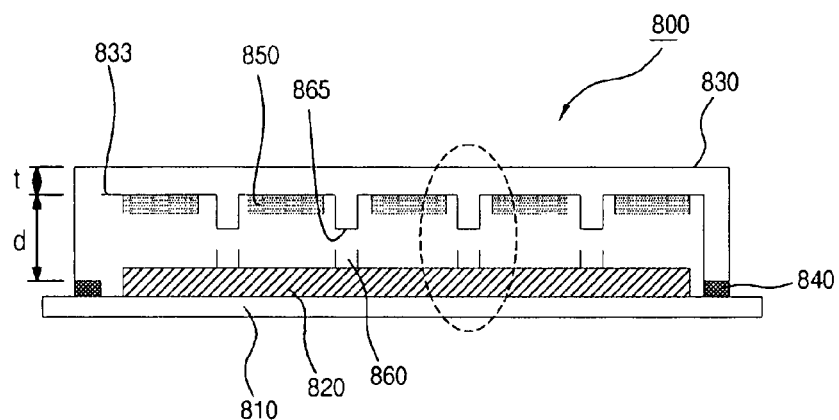
[Fig. 9]
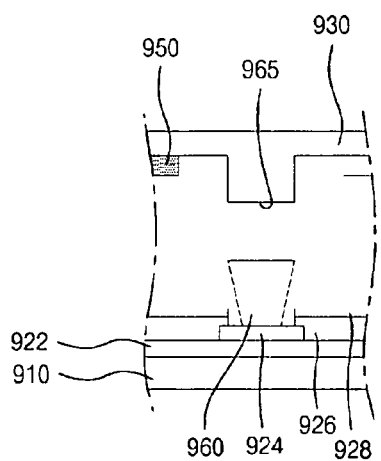

[Fig. 10]
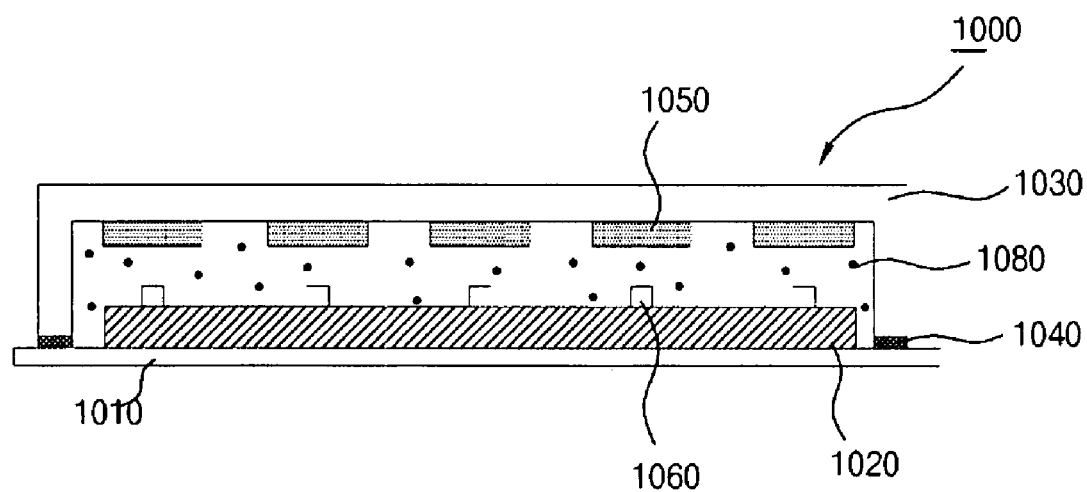

LIGHT EMITTING DEVICE HAVING SPACER FOR PROTECTING LIGHT EMISSION UNIT FROM MOISTURE ABSORBENT

TECHNICAL FIELD

The present invention relates to a light emitting device.

BACKGROUND ART

Recently, light emitting devices have been considered for use as display devices. The light emitting device comprises an electron injection electrode, a hole injection electrode and an emission unit formed between the electron injection electrode and the hole injection electrode. When injecting electron charges into the emission unit, the injected electron and the injected hole are paired, and then the extinction of the injected hole-electron pair results in electroluminescence. There has been extensive research focused on developing a light emitting device with a low driving voltage, a wide viewing angle, a decrease in power consumption, an excellent characteristic in light-weight, a color, and the like. However, because the light emitting device has a short operational life span, extensive commercialization of the light emitting device has not yet been achieved.

The life span of the light emitting device is determined by two factors. One factor is a decrease in luminance of the light emitting device when driving the light emitting device. The decrease in luminance of the light emitting device is caused by impurities in an organic material forming an emission layer, an interface between the organic material and the electrode, a low glass transition temperature (Tg) of the organic material, oxidation of the light emitting device by oxygen and moisture. The other factor is that even if the light emitting device is not in use, an emission region gradually decreases by moisture and therefore the light emitting device fails to emit light. Thus, the life span of the light emitting device is determined by one factor with a smaller value of the two factors.

In a manufacturing process of the light emitting device, moisture exists inside the light emitting device. Moisture also permeates from the outside of the light emitting device. The moisture permeated from the outside of the light emitting device negatively effects the performance of the light emitting device. Thus, various methods had been proposed to solve the above problem relating to the moisture. The representative method is to cover the light emitting device with a shield cap made of a metal material or a glass material. This is called an encapsulation method.

DISCLOSURE OF INVENTION

Technical Problem

FIG. 1 is a cross-sectional view of a related art organic light emitting device.

Referring to FIG. 1, a related art organic light emitting device 100 comprises a substrate 110, an emission unit 120 which is located on the substrate 110 and includes a first electrode, a second electrode and an emission layer interposed between the first and second electrodes, and a shield cap 130 adhered to the substrate 110 to encapsulate the emission unit 120.

The substrate 110 and the shield cap 130 are adhered to each other using a sealant 140 such as photo-crosslinked epoxy resin or thermosetting epoxy resin. Further, a thin film type moisture absorbent 150 is adhered to an inside surface 135 of the shield cap 130.

FIG. 2 is a plane view of a related art organic light emitting device.

Referring to FIG. 2, an emission unit 220 is formed on a substrate 210. A moisture absorbent 250 is located inside a shield cap 230 at a position corresponding to the emission unit 200.

When an external pressure is pressed on the shield caps 130 and 230 or the substrates 110 and 210 of the organic light emitting devices 100 and 200, the external pressure causes the deformation of the shield caps 130 and 230 or the substrates 110 and 210. As a result, since the shield caps 130 and 230 contact the emission units 120 and 220, the emission units 120 and 220 is damaged.

Moreover, when the emission units 120 and 220 contact the moisture absorbents 150 and 250 located on the shield caps 130 and 230, there is a serious problem in that the emission units 120 and 220 are polluted with the moisture absorbents 150 and 250.

In particular, as the size of a panel becomes larger, the amount used of the moisture absorbents 150 and 250 increases. As a result, the above-described problems frequently occurred. In other words, the pollution of the emission units 120 and 220 results in the degradation of the organic light emitting device and a reduction in life span of the organic light emitting device.

To overcome the above-described problems, it was proposed to maintain strength of the shield caps 130 and 230 by sufficiently thickly forming the shield caps 130 and 230. In a case of the substrate for a mobile communication terminal of 1-3 inches, a thickness of the shield caps 130 and 230 made of a metal is 0.1-0.5 t (0.1-0.5□) and the thickness of the shield caps 130 and 230 made of a glass is 0.3-1.0 t (0.3-1.0□). However, in a case of the substrates 110 and 210 for a mobile communication terminal of 4-8 inches or 10 inches or more, the thickness of the shield caps 130 and 230 is very thick to reduce an influence of an external impact on the substrate. Thus, the organic light emitting device is very heavy-weight.

Technical Solution

Accordingly, embodiments of the present invention provide a thin type light-weight organic light emitting device efficiently, that is efficiently protected from an external impact by filling a space between a substrate and a shield cap with an inert liquid or an inert gas or by forming a spacer.

Advantageous Effects

Embodiments of the present invention can provide an organic light emitting device capable of being efficiently protected from an external impact. The embodiments of the present invention can also provide a thin type light-weight organic light emitting device.

BRIEF DESCRIPTION OF THE DRAWINGS

FIG. 1 is a cross-sectional view of a related art organic light emitting device.

FIG. 2 is a plane view of a related art organic light emitting device.

FIG. 3 is a cross-sectional view of an organic light emitting device according to a first embodiment of the present invention.

FIG. 4 is a cross-sectional view of an organic light emitting device according to a second embodiment of the present invention.

FIG. 5 is a partial enlarged view of FIG. 4.

FIG. 6 is a cross-sectional view of an organic light emitting device according to a third embodiment of the present invention.

FIG. 7 is a plane view of the organic light emitting device according to the third embodiment of the present invention.

FIG. 8 is a cross-sectional view of an organic light emitting device according to a fourth embodiment of the present invention.

FIG. 9 is a partial enlarged view of FIG. 8.

FIG. 10 is a cross-sectional view of an organic light emitting device according to a fifth embodiment of the present invention.

MODE OF THE INVENTION

First Embodiment

FIG. 3 is a cross-sectional view of an organic light emitting device according to a first embodiment of the present invention.

Referring to FIG. 3, an organic light emitting device 300 according to the first embodiment of the present invention comprises a substrate 310, and an emission unit 320 which is located on the substrate 310 and includes a first electrode, a second electrode and an emission layer interposed between the first and second electrodes. The emission unit 320 is encapsulated by adhering the substrate 310 to a shield cap 330 using a sealant 340. Here, the emission unit 320 may be made of an organic material.

In the organic light emitting device 300 according to the first embodiment of the present invention, an internal space between the substrate 310, on which the emission unit 320 is formed, and the shield cap 330 is filled with an inert liquid 370. A fluorine-based material is used as the inert liquid 370. The fluorine-based material does not react on the emission unit 320 and is not deformed by an external pressure. However, the present invention is not limited thereto. When an external pressure is pressed on the substrate 310 or the shield cap 330, the inert liquid 370 prevents the contact of the emission unit 320 and the shield cap 330 by the deformation of the substrate 310 and the shield cap 330 caused by the external pressure. In other words, the inert liquid 370 performs as a buffer function.

Further, the inert liquid 370 may comprise a powder type moisture absorbent 350. When the inert liquid 370 comprises the powder type moisture absorbent 350, the inert liquid 370 simultaneously performs both a buffer function and a moisture absorption function.

Second Embodiment

FIG. 4 is a cross-sectional view of an organic light emitting device according to a second embodiment of the present invention.

Referring to FIG. 4, an organic light emitting device 400 according to the second embodiment of the present invention comprises a substrate 410 including an emission region and a non-emission region, an emission unit 420 which is located on the substrate 410 and includes a first electrode, a second electrode and an emission layer interposed between the first and second electrodes, and a shield cap 430 adhered to the substrate 410 to encapsulate the emission unit 420. The substrate 410 is adhered to the shield cap 430 made of a metal or glass using a sealant 440 such as photo-crosslinked epoxy resin or thermosetting epoxy resin. Further, organic and/or inorganic thin film, a metal film, and the like, together with the shield cap 430 may be formed on the emission unit 420.

A plurality of moisture absorbents 450 are adhered to an inside surface 433 of the shield cap 430. The moisture absorbent 450 may be a thin film type moisture absorbent. Various types of absorbents other than the thin film type moisture absorbent may be used. For example, a powder type moisture absorbent sealed with a permeability tape may be used.

A plurality of spacers 460 are located on the substrate 410. The heights of the spacers 460 are more than the height of the emission unit 420. The spacers 460 are formed at a position corresponding to the plurality of moisture absorbents 450 located on the inside surface 433 of the shield cap 430. The spacers 460 prevent the damage of the emission unit 420 by the deformation of the shield cap 430 or the substrate 410 caused by the external pressure.

In other words, although the shield cap 430 and the substrate 410 are deformed by the external pressure, the moisture absorbent 450 located inside the shield cap 430 contacts not the emission unit 420 but the spacer 460. That is, since the spacer 460 performs a buffer function, the degradation and the damage of the emission unit 420 are prevented. Thus, when manufacturing a large-area organic light emitting display apparatus, the emission unit 420 is protected without an increase in a thickness t and a depth d the shield cap 430. Thus, the thickness, the weight and the volume of the organic light emitting device 400 decrease.

The spacer 460 may be an organic layer made of photoresist, polyimide or polyacryl, and the like, or an inorganic layer made of $SiO_X$ or $SiN_Y$, and the like. Further, the spacer 460 may have a multi-layered structure including the organic layer and the inorganic layer. When the spacer 460 has the multi-layered structure, it is preferable that an outermost layer of the spacer 460 is an inorganic layer to prevent the moisture or impurities of the moisture absorbent 450 from being transmitted to the emission unit 420 by the contact of the moisture absorbent 450 and the spacer 460.

Further, it is preferable that an increase in the number of spacers 460 and the height of the spacers 460 is proportionate to an increase in the impact and the deformation of the shield cap 430 caused by the external pressure. The spacer 460 may be formed on the entire surface of the substrate 410. The spacer 460 may be formed on only a region of the middle of the substrate 410 where the deformation of the substrate 410 or the shield cap 430 is mainly generated. When the size of the spacer 460 is equal to or less than 100 □ and the height of the spacer 460 is equal to or less than several hundreds of □, the stability of the organic light emitting device is secured. However, the present invention is not limited thereto.

FIG. 5 is a partial enlarged view of FIG. 4.

Referring FIG. 5, an organic light emitting device 500 comprises a substrate 510, a first electrode 552 located on the substrate 510, an insulating layer 524 which is located on the first electrode 552 and exposes a part of the first electrode 552, an emission layer 526 located on the exposed first electrode, and an emission unit 520 including a second electrode 528 located on the emission layer 526.

A spacer 560 is located on the insulating layer 524 corresponding to a non-emission region. The height of the spacer 560 is more than the height of the emission unit 520. The spacer 560 is formed opposite to a moisture absorbent of a shield cap 530. Since the spacer 560 is formed on the first electrode 552 and the non-emission region on the insulating layer 524, as shown in FIG. 5, the emission layer 526 and the second electrode 528 may be formed on the spacer 560.

Since the second electrode 528 is patterned by a barrier rib 563 in the organic light emitting device 500 according to the second embodiment of the present invention, the barrier rib 563 is formed on the non-emission region of the insulating layer 524. Thus, when forming the barrier rib 563, the spacer 560 of the height different from the height of the barrier rib 563 may be formed using a halftone mask. Otherwise, after forming the barrier rib 563, an organic material or an inorganic material may be stacked on the barrier rib 563, and then may be patterned to form the spacer 560 on the barrier rib 563.

One spacer 560 is formed opposite to one moisture absorbent 550 in FIG. 5. However, since the size of the moisture absorbent 550 in a practical display is several tens of times larger than the size of a pixel, several tens of the spacers 560 may be located in the range of corresponding to the width of one moisture absorbent 550. The spacers 560 are located on the insulating layer 524 corresponding to the non-emission region not to reduce the emission area of the organic light emitting device 500.

In the second embodiment of the present invention, the organic light emitting device is a passive matrix type and the spacer 560 is formed on the insulating layer 524 of the non-emission region. However, the spacer 560 may be formed on another non-emission region other than the insulating layer 524. Further, when the organic light emitting device is an active matrix type which turns on/off a voltage of the first electrode using a thin film transistor or a storage capacitor, the spacer 560 may be formed on a non-emission region where the thin film transistor or the storage capacitor is located.

In the second embodiment of the present invention, the spacer 560 is formed on the non-emission region not to reduce the emission area of the organic light emitting device. However, the spacer 560 may be formed on the emission region where the first electrode, the emission layer and the second electrode are stacked, in spite of a reduction in the emission area.

Third Embodiment

FIG. 6 is a cross-sectional view of an organic light emitting device according to a third embodiment of the present invention.

Referring to FIG. 6, an organic light emitting device 600 according to the third embodiment of the present invention comprises a substrate 610, an emission unit 620 which is located on the substrate 610 and includes a first electrode, a second electrode and an emission layer interposed between the first and second electrodes, and a shield cap 630 adhered to the substrate 610 to encapsulate the emission unit 620. The substrate 610 and the shield cap 630 are adhered to each other using a sealant 640 such as photo-crosslinked epoxy resin or thermosetting epoxy resin.

A plurality of spacers 660 are located on an inside surface 633 of the shield cap 630. Thin film type moisture absorbents 650 are located between the plurality of spacers 660. The height of the spacer 660 may be more than the thickness of the moisture absorbents 650.

The spacer 660 may be formed by stacking an organic material or an inorganic material and then patterning the stacked material. Further, the spacer 660 may be formed by etching the shield cap 630.

FIG. 7 is a plane view of the organic light emitting device according to the third embodiment of the present invention.

In an organic light emitting device 700 according to the third embodiment of the present invention, spacers 760 of a mesh structure are formed on an inside surface of a shield cap 730. Moisture absorbents 750 are located inside a space limited by the spacers 760. The width of the spacers 760 may be properly modified in consideration of the size of a display and the estimated amount of modification of the display.

Referring to FIGS. 6 and 7, although the shield caps 630 and 730 or the substrates 610 and 710 are deformed by an external pressure in the organic light emitting device according to the third embodiment of the present invention, it is possible to prevent the damage of the emission units 620 and 720 generated by the contact of the moisture absorbents 650 and 750 located on the inside surfaces 633 and 733 of the shield caps 630 and 730 and the emission units 620 and 720.

That is, the emission units 620 and 720 contact not the moisture absorbents 650 and 750 located on the inside surfaces 633 and 733 of the shield caps 630 and 730 but the spacers 660 and 760. Thus, it is possible to prevent the degradation or the damage of the emission units 620 and 720 caused by the external pressure.

Fourth Embodiment

FIG. 8 is a cross-sectional view of an organic light emitting device according to a fourth embodiment of the present invention.

Referring FIG. 8, an organic light emitting device 800 according to the fourth embodiment of the present invention comprises a substrate 810, an emission unit 820 which is located on the substrate 810 and includes a first electrode, a second electrode and an emission layer interposed between the first and second electrodes, and a shield cap 830 adhered to the substrate 810 to encapsulate the emission unit 820. The substrate 810 and the shield cap 830 are adhered to each other using a sealant 840 such as photo-crosslinked epoxy resin or thermosetting epoxy resin.

A plurality of first spacers 860 are located on the substrate 810. The heights of the first spacers 860 are more than the height of the emission unit 820. A plurality of second spacers 865 are located inside the shield cap 830 to oppose to the plurality of first spacers 860. Thin film type moisture absorbents 850 are located between the plurality of second spacers 865. The height of the second spacers 835 may be more than the thickness of the moisture absorbents 850.

FIG. 9 is a partial enlarged view of FIG. 8.

Referring to FIG. 9, an organic light emitting device 900 comprises a substrate 910, a first electrode 922 located on the substrate 910, an insulating layer 924 for exposing a part of the first electrode 922 and insulating the first electrode 922, an emission layer 926 located on the first electrode, and an emission unit 920 including a second electrode 928 located on the emission layer 926.

A first spacer 960 is located on a non-emission region of the insulating layer 924. The height of the first spacer 960 is more than the height of the emission unit 920. Since the first spacer 960 is formed after forming the first electrode 922 and the insulating layer 924, the emission layer 926 and the second electrode 928 may be formed on the first spacer 960.

Second spacers 965 are formed on an inside surface 933 of the shield cap 930 to oppose to the first spacer 960. A moisture absorbent 950 is located between the second spacers 965. The height of the second spacers 965 may be more than the thickness of the moisture absorbents 950.

Referring to FIGS. 8 and 9, since the organic light emitting device according to the fourth embodiment of the present invention comprises the first spacers 860 and 960 and the second spacers 865 and 965, it is possible to prevent the damage of the emission units 820 and 920 caused by the deformation of the shield caps 830 and 960 or the substrates 810 and 910 by an external pressure.

In other words, although the shield caps 830 and 930 and the substrates 810 and 910 are deformed by the external pressure, the first spacers 860 and 960 contact the second spacers 865 and 965. The emission units 820 and 920 do not contact the moisture absorbents 850 and 950 located on the inside surfaces 833 and 933 of the shield caps 830 and 930. That is, since the first spacers 860 and 960 and the second spacers 865 and 965 perform a buffer function, the degradation and the damage of the emission units 820 and 920 are prevented. Thus, when manufacturing a large-area organic light emitting display apparatus, the emission units 820 and 920 are protected without an increase in a thickness t and a depth d of the shield caps 830 and 930. Thus, the thickness, the weight and the volume of the organic light emitting devices 800 and 900 decrease.

The first spacers 860 and 960 and the second spacers 865 and 965 may be formed by stacking an organic material or an inorganic material and then patterning the stacked material. Further, the second spacers 865 and 965 may be formed by etching the shield caps 830 and 930.

Fifth Embodiment

FIG. 10 is a cross-sectional view of an organic light emitting device according to a fifth embodiment of the present invention.

Referring FIG. 10, an organic light emitting device 1000 according to the fifth embodiment of the present invention comprises a substrate 1010, an emission unit 1020 which is located on the substrate 1010 and includes a first electrode, a second electrode and an emission layer interposed between the first and second electrodes, and a shield cap 1030 adhered to the substrate 1010 to encapsulate the emission unit 1020. The substrate 1010 and the shield cap 1030 are adhered to each other using a sealant 1040 such as photo-crosslinked epoxy resin or thermosetting epoxy resin.

A plurality of spacers 260 are located on the substrate 210. The heights of the spacers 260 are more than the height of the emission unit 220. The spacers 260 are formed opposite to a plurality of moisture absorbents 1050 located on an inside surface 1033 of the shield cap 830. Thus, although the shield cap 1030 or the substrate 1010 is deformed by an external pressure, the damage of the emission unit 1020 is prevented.

An internal space between the substrate 1010, on which the emission unit 1020 is located, and the shield cap 1030 is filled with an inert gas or a neutral gas 1080 of a high pressure. The inert gas or the neutral gas 1080 performs a buffer function and prevents the deformation of the substrate 1010 and the shield cap 1030 caused by the external pressure. Thus, it is possible to solve a pollution problem generated by contacting the moisture absorbent 1050 located on the inside surface 1033 of the shield cap 1030 and the emission unit 1020 by the external pressure.

INDUSTRIAL APPLICABILITY

While the exemplary embodiments of the present invention have been described with reference to the attached drawings, it will be understood by those of ordinary skill in the art that various changes in form and details may be made therein without departing from the spirit and scope of the present invention. Rather, the exemplary embodiments are provided so that this disclosure will be thorough and complete and fully conveys the concept of the invention to those of ordinary skill in the art. Such variations are not to be regarded as a departure from the spirit and scope of the invention, and all such modifications as would be obvious to those of ordinary skilled in the art are intended to be included within the scope of the following claims.

The invention claimed is:

1. A light emitting device comprising:
   a substrate comprising an emission region for displaying video data and a non-emission region except the emission region;
   an emission unit which is located on the emission region and comprises a first electrode, a second electrode and an emission layer interposed between the first and second electrodes;
   a shield cap adhered to the substrate to encapsulate the emission unit;
   an inert liquid or an inert gas in a space between the substrate and the shield cap;
   a first spacer with the height more than the height of the emission unit, which is located on the substrate; and
   a second spacer which is located on an inside surface of the shield cap at a position corresponding to the first spacer.

2. The light emitting device of claim 1, wherein the inert liquid is a fluorine-based material.

3. The light emitting device of claim 1, wherein the inert liquid comprises a powder type moisture absorbent.

4. The light emitting device of claim 1, further comprising a spacer with the height more than the height of the emission unit, which is located on the substrate.

5. The light emitting device of claim 4, wherein the spacer is located on the non-emission region of the substrate.

6. The light emitting device of claim 5, further comprising an insulating layer which is located on the first electrode and exposes a part of the first electrode, wherein the spacer is located on the insulating layer of the non-emission region of the substrate.

7. The light emitting device of claim 5, further comprising an insulating layer which is located on the first electrode and exposes a part of the first electrode, wherein a barrier rib for patterning the second electrode and the spacer are located on the insulating layer of the non-emission region.

8. The light emitting device of claim 7, wherein the barrier rib and the spacer are simultaneously formed using a halftone mask process.

9. The light emitting device of claim 4, wherein the spacer is located on the emission region of the substrate.

10. The light emitting device of claim 1, further comprising a moisture absorbent located on the inside surface of the shield cap.

11. The light emitting device of claim 1, wherein the emission layer is made of an organic material.

12. A light emitting device comprising:
    a substrate comprising an emission region for displaying video data and a non-emission region except the emission region;
    an emission unit which is located on the emission region and comprises a first electrode, a second electrode and an emission layer interposed between the first and second electrodes;
    a shield cap adhered to the substrate to encapsulate the emission unit;
    a first spacer with the height more than the height of the emission unit, which is located on the substrate; and
    a second spacer which is located on an inside surface of the shield cap at a position corresponding to the first spacer.

13. The light emitting device of claim 12, further comprising an inert liquid or an inert gas in a space between the substrate and the shield cap.

14. The light emitting device of claim 12, further comprising a moisture absorbent which is formed at a position different from a position of the second spacer on the inside surface of the shield cap.

15. The light emitting device of claim 12, wherein the height of the second spacer is more than the thickness of the moisture absorbent.

16. The light emitting device of claim 12, further comprising an insulating layer which is located on the first electrode and exposes a part of the first electrode, wherein the spacer is located on the insulating layer of the non-emission region.

17. The light emitting device of claim 12, wherein the emission layer is made of an organic material.

* * * * *